United States Patent
Hussain et al.

(10) Patent No.: US 6,694,495 B1
(45) Date of Patent: Feb. 17, 2004

(54) METHOD OF ANALYZING STATIC CURRENT TEST VECTORS FOR SEMICONDUCTOR INTEGRATED CIRCUITS

(75) Inventors: Hunaid Hussain, Milpitas, CA (US); Pradipta Ghosh, Milpitas, CA (US)

(73) Assignee: LSI Logic Corporation, Milpitas, CA (US)

(*) Notice: Subject to any disclaimer, the term of this patent is extended or adjusted under 35 U.S.C. 154(b) by 90 days.

(21) Appl. No.: 09/879,506

(22) Filed: Jun. 12, 2001

Related U.S. Application Data

(60) Provisional application No. 60/236,903, filed on Sep. 28, 2000.

(51) Int. Cl.[7] .................... G06F 17/50; G01R 31/28
(52) U.S. Cl. ...................... 716/4; 716/2; 716/18; 714/724
(58) Field of Search .................. 716/4, 2, 18; 714/724

(56) References Cited

U.S. PATENT DOCUMENTS 5,670,890 A * 9/1997 Colwell et al. ............. 324/765
6,212,655 B1 * 4/2001 Ghanta et al. .............. 714/724
6,449,751 B1 * 9/2002 Hussain et al. ............. 716/4

OTHER PUBLICATIONS

Kaushik De et al., Failure Analysis for Full–Scan Circuits, Proceedings of the International Test Conference, pp. 636–645, Oct. 1995.*

P. Maxwell et al., IDDQ and AC Scan: The War Against UnModelled Defects, Proceedings of the International Test Conferenc pp. 250–258, Oct. 1996.*

* cited by examiner

Primary Examiner—A. M. Thompson
(74) Attorney, Agent, or Firm—Westman, Champlin & Kelly

(57) ABSTRACT

A method is provided for analyzing a test vector for use in measuring static current consumed by an integrated circuit that has an embedded memory device. According to the method, a potential test vector is applied to a functional model of the integrated circuit. The logic states of various nodes in the integrated circuit are detected in response to the potential test vector. At least some of the nodes correspond to the input address bits of the memory device, where the memory device has a valid address range on the input address bits. An output is produced for the potential test vector based on whether these logic states correspond to an address within the valid address range.

13 Claims, 3 Drawing Sheets

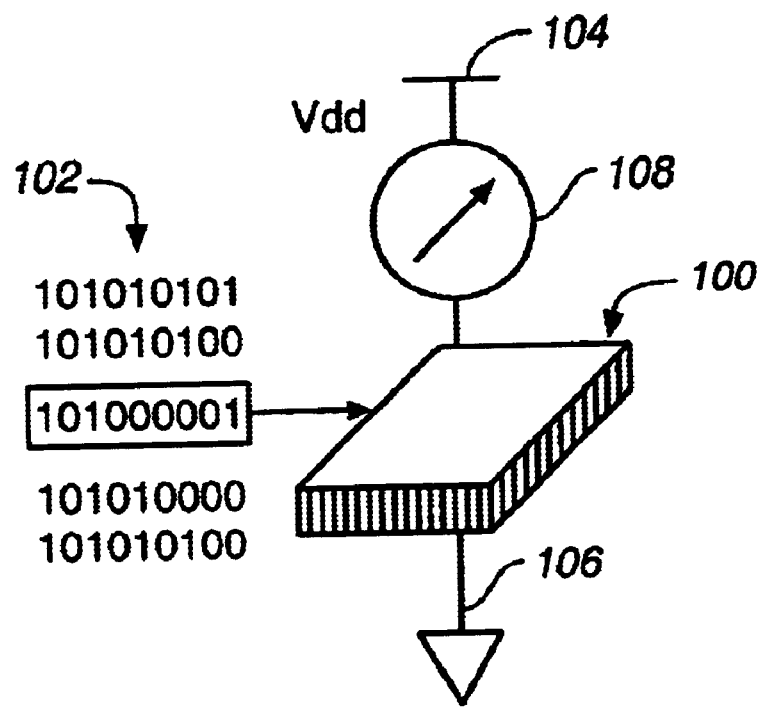
FIG._1
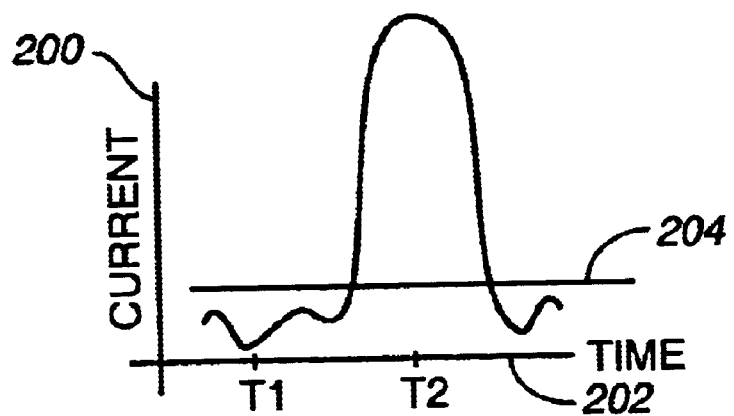
FIG._2

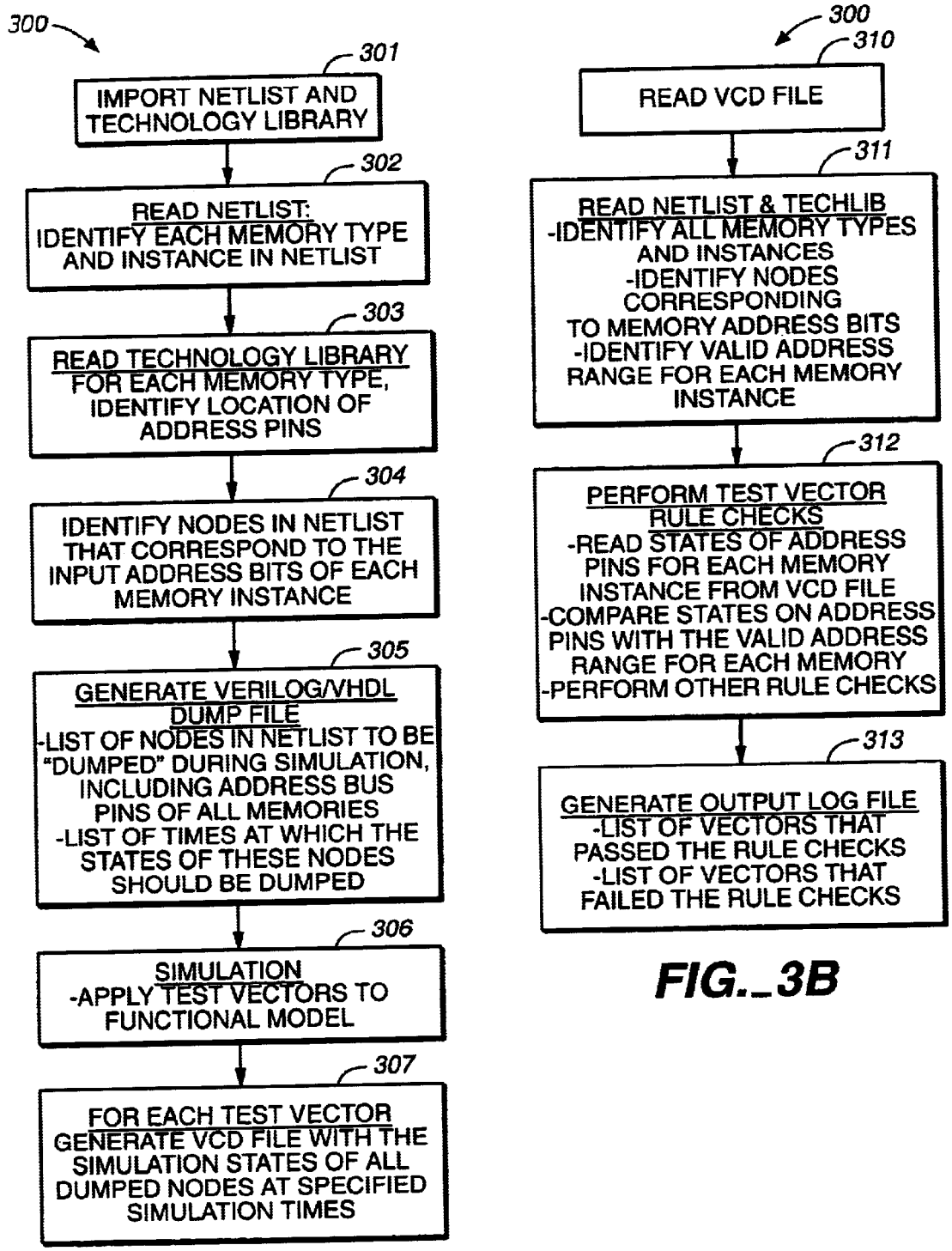
FIG._3A
FIG._3B

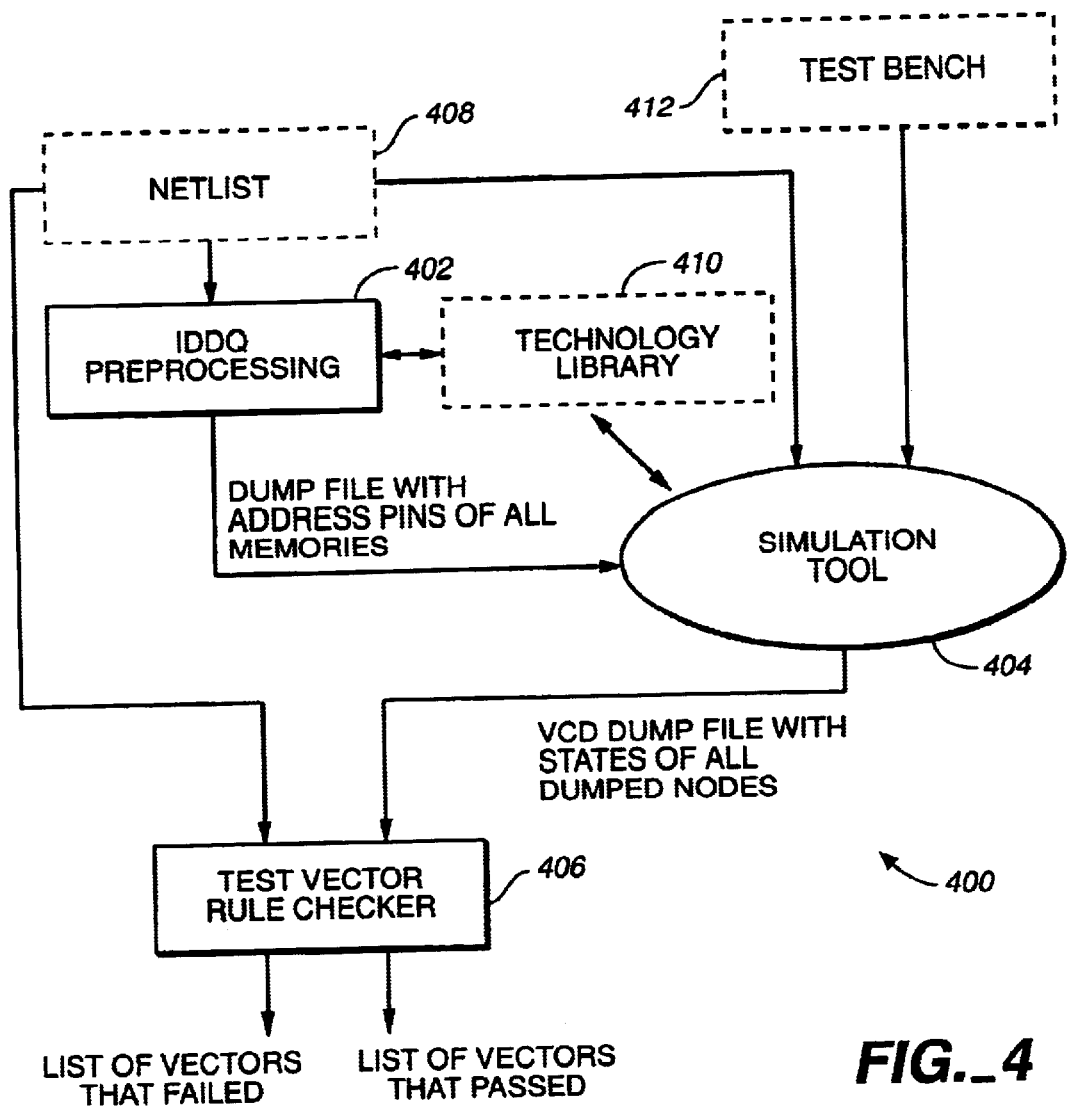
FIG._4

METHOD OF ANALYZING STATIC CURRENT TEST VECTORS FOR SEMICONDUCTOR INTEGRATED CIRCUITS

CROSS-REFERENCE TO RELATED APPLICATION

This application claims the benefit of U.S. Provisional Application Serial No. 60/236,903, entitled "CHECKING VALIDITY OF MEMORY ADDRESSING IN IDDQ TESTING," filed Sep. 28, 2000.

FIELD OF THE INVENTION

The present invention relates to testing integrated circuits for potential fabrication faults. More specifically, the present invention relates to a method of selecting test vectors for use in static current testing of integrated circuits having embedded memory devices.

BACKGROUND OF THE INVENTION

Static current testing has been used to detect potential fabrication faults in complementary metal-oxide semiconductor (CMOS) circuits. Static current testing is based on an assumption that a fault-free CMOS circuit draws very little supply current in a steady state. This current is know as "leakage" current. Certain manufacturing faults on an integrated circuit cause unwanted shorts within the devices fabricated on the integrated circuit. Under certain test A conditions, these shorts can cause an increase in the current drawn by the integrated circuit. A faulty integrated circuit often draws current that is several orders of magnitude greater than that drawn by a non-faulty integrated circuit. Therefore, the leakage current drawn by an integrated circuit under certain test conditions can be used to indicated the presence of a manufacturing defect in the circuit.

Static current testing is performed by applying test vectors to the integrated circuit and making multiple current measurements during a quiescent state of the circuit. A test vector is typically applied to the circuit by serially shifting the test vector into the circuit through a chain of "scannable" elements and then clocking the circuit. The test vectors that are used for static current testing must contain vectors that will put the circuit into a low drain current ($I_{DD}$) state. Static current testing is often referred to as $I_{DDQ}$ testing.

Once the circuit is in the desired state, the circuit is "strobed" near the end of a period's clock cycle. That is, a snap shot of the circuit is taken, and the status of selected pins and nets is recorded along with the stability of the circuit. The strobe point for each $I_{DDQ}$ test vector is usually the last time unit in the clock cycle. If the state of the circuit at a particular strobe point is such that a defect-free chip in that state would not draw supply current, then the test vector and the resulting test patterns obtained at that strobe point can be successfully used for $I_{DDQ}$ testing.

When selecting which test vectors should be used for static current testing of an integrated circuit, the response of the circuit to the potential test vectors is simulated on a functional model of the integrated circuit. Each test vector is scanned into the functional model, the model is then "clocked" and the resulting states on selected nodes within the model are recorded at multiple instants in time. The recorded states are output in the form of a value change dump (VCD) file. The states in the VCD file are then analyzed to determine whether the particular vector is a candidate for $I_{DDQ}$ testing. An $I_{DDQ}$ analyzer checks the states of the circuit against a set of rules to determine whether the circuit would draw current in that state. If not, the vector producing that state is a potential test vector for the $I_{DDQ}$ test.

A difficulty arises in selecting potential test vectors for integrated circuits having embedded memory devices. In some integrated circuit designs, it may be desirable for a memory bus have more address bits than are required to address the maximum number of rows actually present in the memory. For example, an integrated circuit design having three address bits can address eight memory locations. However, the actual number of addressable rows in the memory could be less than eight, such as six. In this case, if the test vector sets the states of the address bits such that the address bits address memory locations that do not physically exist in the memory, leakage current can flow through the sense amplifiers. This makes it more difficult to select valid test vectors for static current testing.

In order to avoid addressing memory locations that do not physically exist, the current approach toward solving this problem is to restrict the integrated circuit design to have memories that conform to the maximum addressable size of the address buses on the integrated circuit. This approach leaves the semiconductor designer with very few choices in terms of memory size. As a result, the semiconductor designer may have to use a memory having more rows than is required for the particular design in order for the memory to conform to the maximum addressable size of the address bus. Increasing the memory size results in consumption of costly silicon space and an increase in power consumption.

SUMMARY OF THE INVENTION

One embodiment of the present invention is directed to a method for analyzing a test vector for use in measuring static current consumed by an integrated circuit having an embedded memory device. According to the method, a potential test vector is applied to a functional model of the integrated circuit. The logic states of various nodes in the integrated circuit are detected in response to the potential test vector. At least some of the nodes correspond to the input address bits of the memory device, where the memory device has a valid address range on the input address bits. An output is produced for the potential test vector based on whether these logic states correspond to an address within the valid address range.

Another embodiment of the present invention is directed to a computer readable medium having instructions readable by a programmable computer. The instructions, when executed, cause the computer read a computer file that includes logic states of nodes in a functional model of an integrated circuit, wherein the logic states correspond to a response of the model to a potential static current test vector. The computer compares the logic states of selected ones of the nodes that correspond to input address bits of an embedded memory device on the integrated circuit with a valid address range for that memory device. The computer produces an output for the potential test vector based on whether the logic states represent an address within the valid address range.

Yet another embodiment of the present invention is directed to a computer-aided design tool for analyzing static current test vectors. The tool reads a computer file that includes logic states of nodes in a functional model of an integrated circuit. The logic states correspond to a response of the model to a potential static current test vector. The tool compares the logic states of selected ones of the nodes that correspond to input address bits of an embedded memory device on the integrated circuit with a valid address range for that memory device. The tool produces an output for the potential test vector based on whether the logic states represent an address within the valid address range.

BRIEF DESCRIPTION OF THE DRAWINGS

FIG. 1 is a simplified, schematic diagram illustrating static current testing of an integrated circuit according to one embodiment of the present invention.

FIG. 2 is a graph illustrating leakage current drawn by the integrated circuit as measured by a current sensor as a function of time.

FIG. 3A is a flow diagram depicting steps for identifying memory address pins and simulating resulting logic states on the memory address pins from the application of potential test vectors on a functional model of the integrated circuit, according to one embodiment of the present invention.

FIG. 3B is a flow diagram depicting steps for checking the resulting logic states with a set of static current test rules, according to one embodiment of the present invention.

FIG. 4 is a block diagram of a static current test vector analysis apparatus according to one embodiment of the present invention.

DETAILED DESCRIPTION OF ILLUSTRATIVE EMBODIMENTS

FIG. 1 is a simplified, schematic diagram illustrating static current testing of an integrated circuit 100 according to one embodiment of the present invention. Static current testing is performed by applying test vectors 102 to integrated circuit 100 and making multiple current measurements during a quiescent or steady state of the circuit. Static current testing can be applied at a wafer level, a packaged device level, during incoming inspection, during lifetime tests, or during on-line testing.

Integrated circuit 100 is electrically coupled to a text fixture (not shown) which supplies power to the integrated circuit through voltage supply terminals 104 and 106. The test fixture also sets selected inputs to the circuit to a known state and supplies the test vectors 102 for performing the test. A current sensor 108 is coupled in series between voltage supply terminal 104 and one of the power supply pads of integrated circuit 100 for measuring the resulting current drawn by integrated circuit 100.

In one embodiment, each test vector 102 is applied to circuit 100 by serially shifting the test vector into the circuit through a chain of "scannable" elements and then clocking the circuit through its clock input pins. The scannable elements are formed in integrated circuit 100 by including extra logic and a multiplexer to selected sequential elements in the circuit. Each scannable element selects data from a normal data input or a test data input based on a test enable signal provided to integrated circuit 100. The scannable elements are connected together in series to form a scan chain by connecting the output of each scannable element to the test data input of the next, subsequent scannable element in the chain.

When the test enable input to the circuit is activated, the scannable elements switch from the normal data flow mode to the scan mode. Each scannable element is controlled to select data from the test data input as opposed to the normal data input. One of the test vectors 102 is then loaded into the scannable elements by serially shifting the test vector through the scan chain. After the test vector is loaded, the test enable input is deactivated and the scannable elements switch from the scan mode the normal data flow mode. The circuit is then clocked, and current sensor 108 measures the current drawn by circuit 100 after the circuit has returned to a steady state.

The test vectors that are used for static current testing are selected to put circuit 100 into a state such that all sources of DC current in circuit 100 are shut off and the circuit draws little or no drain current through its transistors. Test vectors 102 attempt to initialize circuit 100 so that all design nodes, including enable and control pins of bi-directional buffers and tri-state output buffers are reset. Bus holders are conditioned to a known state. No bus contention or bi-directional conflicts are allowed. Similarly, no floating conditions are allowed. All current-drawing cells, including high-density random access memories (RAMs) are shut off.

Once circuit 100 is in a steady state following application of an individual test vector 102 to the circuit, the DC current drawn through power supply terminals 104 and 106 is measured. If the current exceeds a specified tolerance, there may be a short or some other fault condition in integrated circuit 100. Such a fault can cause a functional failure in the circuit or may have an adverse effect on the lifetime and reliability of the circuit.

FIG. 2 is a graph illustrating the leakage current measured by current sensor 108 (shown in FIG. 1) on axis 200 as a function of time on axis 202. At time T1, a first vector has been scanned into integrated circuit 100 (also shown in FIG. 1), and the circuit has received a rising clock edge on its clock input. At time T2, integrated circuit 100 has reached a steady state following the clock edge that was received at time T1. Line 204 represents a threshold current which is indicative of a maximum leakage current that would be drawn by a non-faulty integrated circuit. Since the steady state current level 206 drawn by integrated circuit 100 exceeds current threshold 204, integrated circuit 100 is assumed to have a manufacturing fault.

When selecting test vectors for use in static current testing, the response of the circuit to each potential test vector is simulated on a functional model of the circuit. Each test vector is scanned into the functional model, the model is "clocked", and the resulting states on selected nodes within the model are recorded at multiple instants in time. The recorded states are analyzed against a predetermined set of rules to determine whether the circuit would draw current in that state. If not, that test vector is a potential test vector for static current testing.

For integrated circuits having embedded memory devices, it is important that the test vectors do not place memory address buses in a state that would attempt to address physical memory locations that do not physically exist in the memory. In some integrated circuit designs, it may be desirable for a memory address bus to have more address bits than are required to address the maximum number of rows actually present in the memory. If the test vector sets the states of the memory address bits so as to address memory locations that do not physically exist in the memory, leakage current can flow through the sense amplifiers of the memory. In one embodiment of the present invention, potential test vectors are checked to determine whether the vectors would set the states of the memory address bits to address memory locations that do not physically exist in the memory. If so, those test vectors are discarded. Only test vectors that place the circuit in a state that addresses valid memory addresses are considered for use in static current testing.

FIGS. 3A and 3B are flow diagrams depicting a method 300 for analyzing potential test vectors for use in static current testing, according to one embodiment of the present invention. The steps performed in FIGS. 3A and 3B can be performed by a single computer-aided design tool or with multiple tools that interact with one another either directly or through suitable output files.

At step 301, a netlist and a semiconductor technology library for the integrated circuit is received. The netlist includes a list of all cells within the integrated circuit and the interconnections between the cells. These cells are selected from the technology library, which is typically provided by the semiconductor manufacturer. The cells in the technology library are defined by cell library definitions. Each cell library definition includes cell layout definitions and characteristics. The cell layout definition includes a layout pattern of the transistors in the cell, geometry data for the cell's transistors, cell routing data and information regarding the cell's inputs and outputs. The cell characteristics include a cell propagation delay and a model of the cell's function.

At step 302, a pre-processing tool uses a netlist reader to read the netlist received at step 301 and identifies each memory type and instance within the netlist. This is done by comparing the cells used in the netlist with known memory types defined in the technology library.

At step 303, the pre-processing tool uses a technology library reader to read the technology library and identifies the locations of all input address pins for each memory type identified in step 302. Based on these locations, the preprocessing tool identifies the nodes in the netlist that correspond to the input address bits of each memory instance in the netlist, at step 304.

At step 305, the pre-processing tool generates a "dump" file which lists the nodes in the netlist that will be monitored during subsequent simulation and later checked against the static current testing rules. These nodes include the nodes that were identified in step 304 as corresponding to the input address bits of each memory instance. Additional nodes can be included in the dump file so that the states on the inputs or outputs of other types of cells in the netlist can also be checked against corresponding rules. The dump file can also include a list of times at which the states of these nodes should be monitored during simulation. The dump file can have any suitable format, such as a Verilog or VHDL file format.

At step 306, a simulation tool simulates the response of a functional model of the integrated circuit, as defined by the netlist and the technology library, to a series of potential test vectors to determine whether each test vector is a candidate for use in static current testing. The test vectors are typically provided with a test bench that has been developed for the particular integrated circuit design. As mentioned above, the simulation tool scans or otherwise loads each test vector into the functional model. The functional model is then "clocked", and the resulting states on the nodes listed in the dump file are recorded at one or more instants in time, at step 307. The strobe point for testing each potential static current test vector is usually the last time unit in the clock cycle. However, other strobe points can also be used. The simulation tool records the states in the form of a value change dump (VCD) file, which can have any suitable file format. The VCD file therefore includes the resulting logic states on the input address pins of each memory device in the netlist, along with the states of other nodes in the netlist.

The VCD file is then provided to a test vector rule checker tool, which checks the recorded simulation states of all dumped nodes against a set of predetermined static current testing rules. FIG. 3B is a flow chart illustrating the steps performed by the rule checker tool. At step 310, the rule checker tool reads the contents of the VCD file. At step 311, the rule checker tool reads the netlist and the technology library to identify all memory types and instances in the netlist and to identify each node in the netlist that corresponds to a memory address bit. The tool also identifies a valid address range for each memory instance.

One or more of the memory instances in the netlist can have more input address bits than are required to address the maximum number of rows actually present in the memory. For example, a memory instance having three row address bits can address eight rows in the memory. However, the actual number of addressable rows could be less than eight, such as six. In this case, the rule checker tool would determine a valid address range for addressing the six addressable rows in the memory. Addresses corresponding to the two non-existent rows of the memory would be outside this valid address range.

At step 312, for each potential test vector, the rule checker tool reads the states of the dumped nodes and checks those states against a variety of rules that indicate whether the particular test vector would place the integrated circuit in a sufficiently low current-drawing state. The rule checker tool compares the states of the nodes corresponding to the input address bits of each memory device to the valid address range of that memory device and produces a failure output for the potential test vector if those logic states correspond to an address outside the valid address range.

In one embodiment, the logic states are compared against the address of the last addressable row in the memory device. If the logic states correspond to an address that exceeds the last addressable row, the tool generates a failure output. In addition, the rule checker tool produces a failure output for the potential test vector if any of the logic states of the input address bits are unknown logic states. An unknown logic state on an input address bit, depending on the location of the bit, implies that the address can potentially exceed the valid address range. Hence, this potential test vector is also disgarded. Similarly, a high impedance logic state on an input address bit can also cause leakage current to flow within the memory. Therefore, the rule checker tool produces a failure output if any of the logic states of the input address bits are high impedance logic states.

Various additional rules can also used to analyze potential test vectors. For example, the integrated circuit should be stable at the strobe point such that there are no pending events. Every input, output and bi-directional pin corresponding to an input or output of the integrated circuit is checked to see that the pin is at a logic low or high state. If an input, output or bi-directional pin of the integrated circuit is pulled up, it must be at a logic high level, and if pulled down, it must be at a logic low level.

Cell-level nets internal to the integrated circuit can also be checked. When a net has only one driver (a gate with an output connected to the net), then the check is successful: if the net is at a low or high logic state; if the net is at an unknown state and the driver is not a tri-state driver; or the net is at an unknown state and driven by a tri-state gate whose enable pin is active. The check fails if the net is at a high impedance state since the net is considered to be floating. The check also fails if the net is at an unknown state and driven by a tri-state gate whose enable pin is unknown (the net is considered to have a potential conflict).

For a cell-level net having more than one driver, the check is successful if the net is at a logic low or high state. The check fails: if the net is at a high impedance state (floating); if the net is at an unknown state and the drivers are not tri-state drivers; or if the net is at an unknown state and the drivers are tri-state drivers. In addition, all cells that can draw static current should be driven to their correct logic level so that they are in a low drain current drawing state. This rule applies to high-speed input-outputs, phase-locked loops, high-density RAMs slew-rate buffers, and other cells.

High-density RAMs should be switched off by setting the chip enable control pin correctly so that no current goes through the sense amplifiers or other active elements in the RAM. During static current testing, the RAM's write enable, chip select, output enable, input address bits and data pins should be controlled either directly or through logic. Input pins generally can be a logic low or a logic high, but should not be switching. The output enable pin should be set such that the data outputs of the memory are in an active state. If two or more memories are connected to the same bus, then at least one and only one of the memories, or some other device should be driving the bus to ensure that the bus is not left floating. The chip select pin of the memory should be disasserted prior to strobing for static current test vectors. When asserted, the chip select pin enables the sense amplifiers, which consume static current. Although unknown logic states generally are not detrimental to static current testing, memory outputs should not be at unknown states so that good coverage of the memory logic can be achieved. Memories should be put into a transparent (pass-through) mode or a sequential mode in which the output pins are at a logic low state or a logic high state when strobing occurs for static current testing. Sequential mode refers to an operation sequence in which one or more memory addresses are written to and then read from. To avoid unknown states on the memory output pins, the locations that are read from should be those that were written to. Other sets of test vector rules can also be used in alternative embodiments. The above-mentioned rules are provided as examples only.

At step 313, the rule checker tool generates an output log and listing file, which provides a list of the test vectors that passed the rule checks and a list of test vectors that failed the rule checks. The test vectors that passed the rule checks are potential test vectors for use during static current testing of the integrated circuit after fabrication.

The method of analyzing potential test vectors described in FIGS. 3A and 3B therefore pre-analyzes memory sizes in the netlist to extract information that can be used to suitably screen potential test vectors for use in static current testing. This makes the flow for generating static current test vectors much more simple. Logic designers are no longer limited to using memories having a fixed size that corresponds to the address bus size (or to using costly logic in to circumvent the problem of having to use fixed size memories) in order to meet static current testing requirements.

FIG. 4 is a block diagram illustrating a static current test vector analysis tool 400 which can be used to perform the steps shown in FIGS. 3A and 3B, according to one embodiment of the present invention. Tool 400 includes an pre-processing tool 402, a logic simulation tool 404 and a test vector rule checker tool 406. Pre-processing tool 402 reads netlist 408 and technology library 410 to identify each memory type and instance in the netlist and to identify the locations of all input address pins. Pre-processing tool 402 generates a Verilog or VHDL dump file containing a list of all nodes in the netlist to the "dumped" during simulation, including the input address pins of all memories in the netlist. This dump file is provided to simulation tool 404. The dump file also includes a list of times at which the states of these nodes should be dumped. Simulation tool 404 receives potential test vectors from test bench 412 and simulates the response of the integrated circuit to each potential test vector based on netlist 408 and the cell characteristics and functional models received from technology library 410. At the specified simulation times, simulation tool 404 generates a VCD dump file containing the states of all nodes listed in the dump file generated by pre-processing tool 404. The VCD dump file is provided to test vector rule checker 406, which analyzes the recorded states based on a predetermined set of rules, as discussed above. Rule checker tool 406 also reads netlist 408 to identify all nodes corresponding to memory address input pins within the netlist. Rule checker tool 406 generates a log and listing file that identifies all vectors that passed the checks and all vectors that failed the test. The vectors that passed the rule checks of rule checker 406 are candidates for use during static current testing following fabrication of the integrated circuit.

Although the present invention has been described with reference to preferred embodiments, workers skilled in the art will recognize that changes may be made in form and detail without departing from the spirit and scope of the invention. For example, individual steps shown in FIGS. 3A and 3B or individual elements shown in FIG. 4 can be implemented in software, hardware, or a combination of both hardware and software. One or more of the steps or elements can be implemented on a computer-readable medium containing instructions which, when executed on a computer, cause the computer to perform the described function.

What is claimed is:

1. A method of analyzing a test vector for use in measuring static current consumed by an integrated circuit having at least one instance of an embedded memory device, the method comprising:

(a) applying a potential test vector to a functional model of the integrated circuit;

(b) detecting logic states of nodes in the integrated circuit corresponding to input address bits of the instance of the embedded memory device in response to applying the potential test vector, wherein the instance of the embedded memory device has a valid address range on the input address bits; and (c) producing an output for the potential test vector based on whether the logic states detected in step (b) correspond to an address within the valid address range.

2. The method of claim 1 wherein step (c) comprises:

(c)(1) generating a log file for the potential test vector; and (c)(2) producing a failure output in the log file for the potential test vector if the logic states detected in step (b) correspond to an address outside of the valid address range.

3. The method of claim 2 wherein step (c) further comprises:

(c)(3) producing a failure output in the log file for the potential test vector if any of the logic states of the address input bits detected in step (b) are unknown logic states.

4. The method of claim 2 wherein step (c) further comprises:

(c)(3) producing a failure output in the log file for the potential test vector if any of the logic states of the address input bits detected in step (b) are high impedance logic states.

5. The method of claim 1 and further comprising:
- (d) identifying each instance of the memory device from a netlist of the integrated circuit, wherein the netlist includes a list of cells within the integrated circuit and interconnections between the cells;
- (e) identifying the nodes in the netlist that correspond to the input address bits of each instance of the memory device that was identified in step (d); and
- (f) generating a list of the nodes in the netlist for which the logic states will be detected in step (b), wherein the list includes all the nodes identified in step (e).

6. The method of claim 1 wherein:

step (a) comprises simulating a response of the functional model to the potential test vector with a computer software simulation program;

step (b) comprises outputting a value change dump file from the simulation program, which lists the logic state of each of the nodes at an instant in time when the functional model is in a substantially steady state; and step (c) comprises inputting the value change dump file into a test vector analysis software program, comparing the states of the nodes corresponding to the input address bits to the valid address range and producing a failure output for the potential test vector if those logic states correspond to an address outside of the valid address range.

7. A computer readable medium comprising instructions readable by a programmable computer which, when executed, cause the computer to perform steps comprising:
- (a) reading a computer file comprising logic states of nodes in a functional model of an integrated circuit, wherein the logic states correspond to a response of the model to a potential static current test vector;
- (b) comparing the logic states of selected ones of the nodes that correspond to input address bits of an instance of an embedded memory device on the integrated circuit with a valid address range for that memory device; and
- (c) producing an output for the potential test vector based on whether the logic states represent an address within the valid address range.

8. The computer readable medium of claim 7 wherein step (c) comprises:
- (c)(1) generating a log file for the potential test vector; and
- (c)(2) producing a failure output in the log file for the potential test vector if the logic states read from the computer file in step (a) correspond to an address outside of the valid address range.

9. The computer readable medium of claim 8 wherein step (c) further comprises:
- (c)(3) producing a failure output in the log file for the potential test vector if any of the logic states of the address input bits are unknown logic states.

10. The computer readable medium of claim 8 wherein step (c) further comprises:
- (c)(3) producing a failure output in the log file for the potential test vector if any of the logic states of the address input bits are high impedance logic states.

11. The computer readable medium of claim 7 wherein the instructions further cause the computer to perform steps comprising:
- (d) applying the potential test vector to the functional model of the integrated circuit;
- (e) detecting logic states of the nodes in the integrated circuit that correspond to the input address bits of the instance of the embedded memory device in response to applying the potential test vector; and
- (f) outputting the logic states detected in step (e) to the computer file.

12. The computer readable medium of claim 11 wherein the instructions further cause the computer to perform steps comprising:
- (g) identifying each instance of the embedded memory device from a netlist of the integrated circuit, wherein the netlist includes a list of cells within the integrated circuit and interconnections between the cells;
- (h) identifying the nodes in the netlist that correspond to the input address bits of each instance of the memory device that was identified in step (f); and
- (i) generating a list of the nodes in the netlist for which the logic states are detected in step (e), wherein the list includes all the nodes identified in step (h).

13. A computer-aided design tool for analyzing static current test vectors, the tool comprising:

means for reading a computer file comprising logic states of nodes in a functional model of an integrated circuit, wherein the logic states correspond to a response of the model to a potential static current test vector;

means for comparing the logic states of selected ones of the nodes that correspond to input address bits of an embedded memory device on the integrated circuit with a valid address range for that memory device; and means for producing an output for the potential test vector based on whether the logic states represent an address within the valid address range.

* * * * *